United States Patent [19]

Wagner et al.

[11] 4,143,253

[45] Mar. 6, 1979

[54] OPTICALLY CLEAR MEMBRANE SWITCH

[75] Inventors: Richard M. Wagner, Harrisburg; Richard H. Zimmerman, Palmyra, both of Pa.

[73] Assignee: AMP Incorporated, Harrisburg, Pa.

[21] Appl. No.: 790,635

[22] Filed: Apr. 25, 1977

[51] Int. Cl.² .................. H01H 9/26; C25D 5/02; C25D 5/34
[52] U.S. Cl. .................. 200/5 A; 200/159 B; 200/268; 200/292; 204/15; 427/98
[58] Field of Search ............... 204/15, 20; 200/5 A, 200/159 B, 268, 292; 427/98

[56] References Cited

U.S. PATENT DOCUMENTS

| 3,296,099 | 1/1967 | Dinella | 204/15 |
| 3,745,095 | 7/1973 | Chadwick et al. | 204/15 |

OTHER PUBLICATIONS

IBM Tech. Disclosure, vol. 15, No. 2, Jul. 1972, pp. 544 and 545.
Plating, Feb. 1972, pp. 135–137.

Primary Examiner—T. M. Tufariello
Attorney, Agent, or Firm—Frederick W. Raring

[57] ABSTRACT

Membrane switch assembly comprises a transparent laminate comprised of three sheets of cellulose acetate material. The intermediate sheet has an opening therein which defines a switch site. Hairline conductors on the internal surfaces of the outer sheets cross each other at the switch site so that the switch is closed when one of the outer sheets is pressed at the switch site. The conductors are produced on the surfaces of the outer sheets by a process including electroless deposition of blanket coatings of conductive metal, selective deposition along lines which define the conductors and selective etching of the blanket coating to leave the hairline conductors.

8 Claims, 7 Drawing Figures

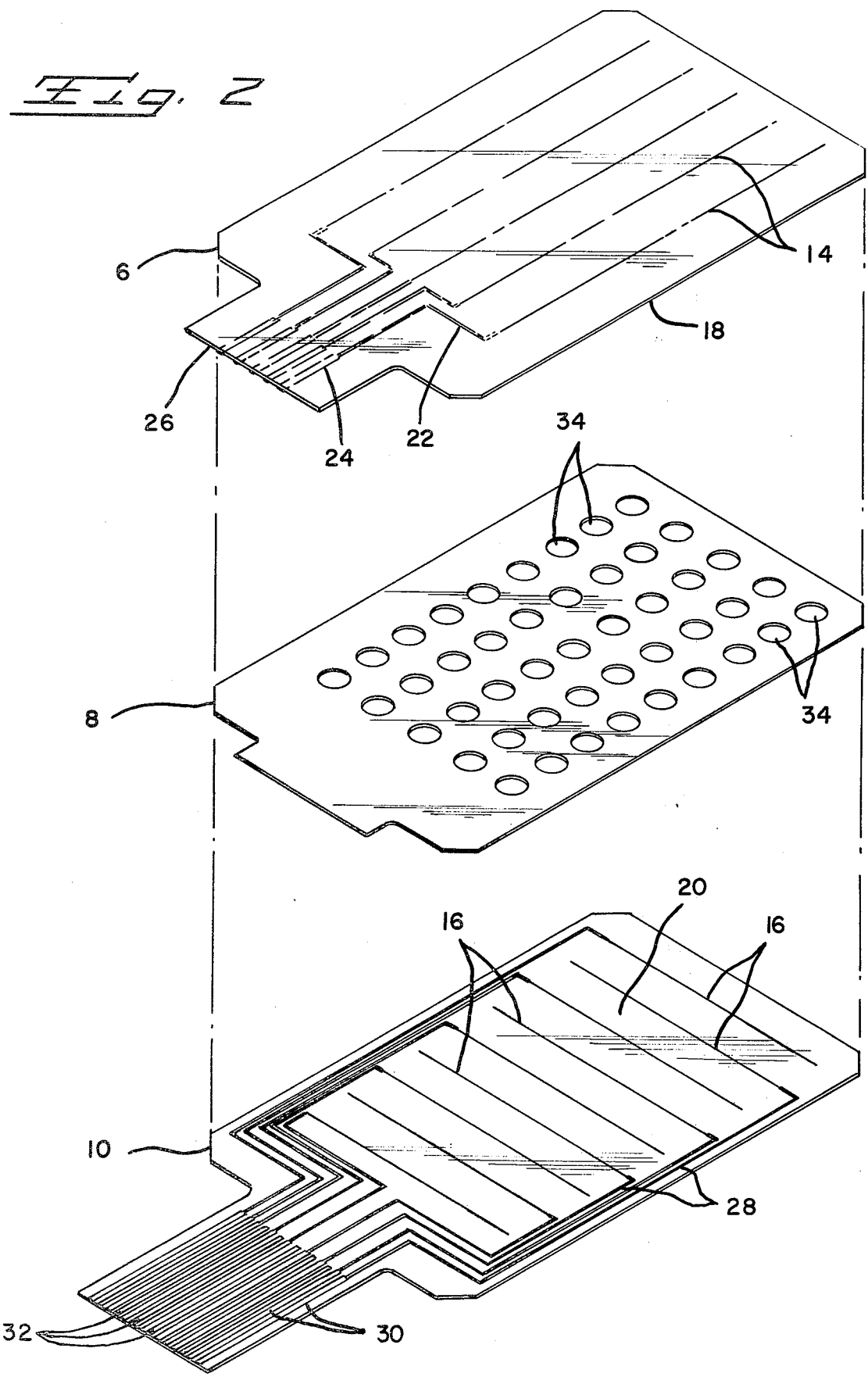

OPTICALLY CLEAR MEMBRANE SWITCH

BACKGROUND OF THE INVENTION

This invention relates to optically clear switch assemblies of the type which are used with display devices.

Membrane switches of the type comprising laminated sheets of suitable film having narrow hairline conductors on their surfaces are widely used and commonly available. Typically, a switch of this type will comprise a substrate having one conductor thereon, a separator or spacer having an opening therein, and a flexible film or diaphragm which also has a conductor thereon. The conductors on the substrate and on the diaphragm cross each other at the opening in the separator so that the switch can be closed by pressing on the diaphragm at the switch site. Polyester film such as Mylar(polyester film) is commonly used for the diaphragm and may also be used for the substrate and the separator although other materials such as filled epoxy are also used for the separator and the substrate.

Ordinarily, membrane switches are placed at a location which is remote from the display area of a device, such as a hand held calculator, and the optical characteristics of the switch assembly are not critical or even important. In fact, most previously known switch assemblies are opaque and their ability to transmit light is of no importance. Typical membrane type switches are shown in U.S. Pat. Nos. 3,308,253, 3,617,660, and 3,600,528.

*Electronics* are now being built which have the switch assembly placed over the display area of the device; see *Electronicas* Nov. 11, 1976, page 27 wherein a hand held terminal is described which has a switch assembly overlying a terminal display so that the user need not take his eyes from the display during the interval between the time he presses selected switches on the terminal and observes the information which appears on the display. In devices of this type, the light transmission characteristics of the switch assembly become critical and a switch assembly having inferior or limited light transmission characteristics would not be suitable. Furthermore, it is desirable to provide a suitable filter on devices having a switch means in overlaying relationship to a display area in order that the information displayed will not be overwhelmed by reflected light and many of the previously used membrane switches have optical characteristics which are incompatible with the use of a suitable filter. Polyester has been used for transparent membrane switch assemblies but its light transmission characteristics are relatively poor and it is, furthermore, incompatible with a polarizing filter.

The instant invention is directed to the achievement of an optically clear switch assembly comprised of laminated sheets of cellulose acetate material such as cellulose tri-acetate. In accordance with the teachings of the instant invention, hairline conductors can be provided on surfaces of cellulose acetate material without chemical or dimensional degradation of the film and excellent adhesion of the conductors to the film is obtained. In general, the process by which the conductors are produced on the surface of the cellulose acetate film involves steps of providing a thin blanket coating of conductive metal on the surface by an electroless deposition process. The blanket coating is then masked with photosensitive resist material, exposed along lines which define the desired conductors, developed and the masking material is removed along the conductor lines. The conductors are then electroplated to the desired thickness, the mask is removed, and the blanket plating is selectively etched away. As will be described below, the complete process requires careful execution of several of the steps of the process to prevent chemical attack of cellulose tri-acetate film which would result in degradation of its physical and optical properties.

It is accordingly an object of the invention to provide an optically clear switch assembly. A further object is to provide a membrane switch assembly having cellulose tri-acetate film laminates. A further object is to provide a method of manufacturing an optically clear membrane switch assembly. A further object is to provide an improved optically clear switch which is shielded.

These and other objects of the invention are achieved in preferred embodiments thereof which are briefly described in the foregoing abstract, which are described in detail below, and which are shown in the accompanying drawing in which:

FIG. 2 is an exploded view of the substrate film, the separator film, and the top film of the switch assembly.

FIG. 3 is a simplified flow diagram of the process of producing conductors on cellulose acetate film in accordance with the invention.

Figure 1:
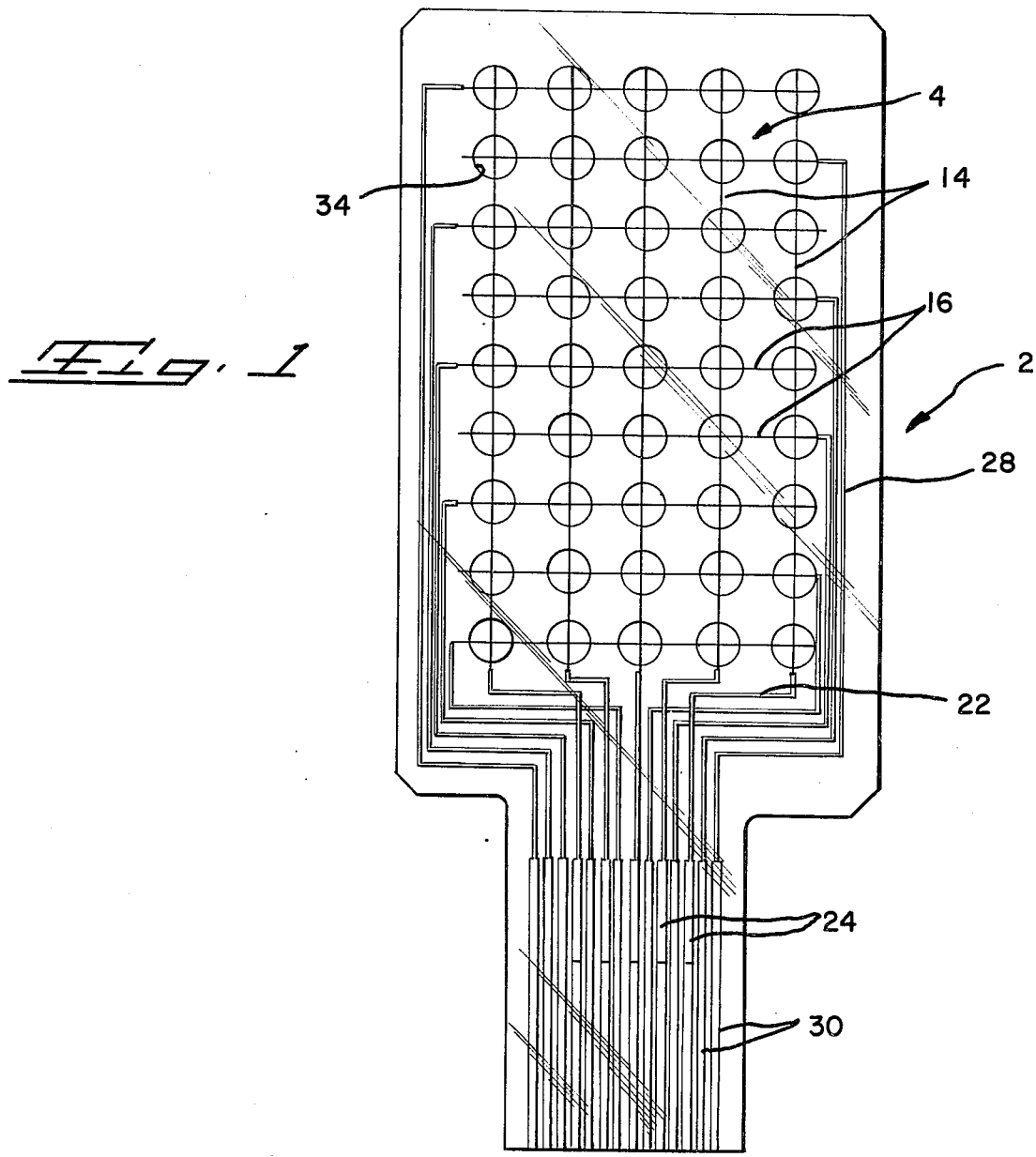
FIG. 1 is a plan view of a switch assembly in accordance with the invention.

Referring first to FIGS. 1 and 2, a preferred form of membrane switch assembly 2 in accordance with the invention comprises a substantially transparent laminate 4 which has first, second, and third sheets of cellulose tri-acetate material 6, 8, 10 respectively. The three sheets of film are bonded to each other along their edges 12 and the second sheet 8 is provided with a plurality of openings 34 which define the individual switch points. Vertically extending (as viewed in the drawing) hairline conductors 14 are provided on the internal surface 18 of the sheet 6, the surface which is against the second sheet of film 8, and horizontally extending conductors 16 are provided on the upwardly facing internal surface 20 of the sheet 10. These conductors cross each other at the switch sites as shown but are normally spaced from each other so that the switch at a particular site can be closed by simply pressing on the external surface of the sheet 6.

The conductors 14 have integral leads 22 which extend to the lower edge 26 of the sheet 6 and the terminal portions 24 of these leads are relatively wider than the conductors 14 or the adjacent portions 22 of the leads. Similarly, the conductors 16 have integral leads 28 which extend downwardly along the marginal side portions of the film 10 and which have terminal portions 30 which are relatively wide. It will be noted that the terminal portions 30 are separated by isolated relatively wide conductors 32 and these relatively wide conductors can be bonded to the wide portions 24 of the conductors 22. All of the conductors 30, 32 can then be connected by any suitable means to other conductors which extend from the switch.

The conductors are produced on the surfaces 18, 20 by a process which is generally described in FIG. 3 and which is described fully in the specific examples given below. The film is advantageously of about five mils in thickness and is prepared first by immersion in a suitable detergent capable of removing any residual oils or other foreign matter on the surface of the film. One suitable detergent which has been found to be satisfactory is a cleaning agent containing wetting agents having a pH of 7 and which is sold under the trademark Neutra Clean 68. This material is used in a one-to-one aqueous solution at room temperature, the film being immersed in the solution is about one minute. After a hot water rinse (55° C.) the film is immersed in a solution containing hydrazine, sodium hydroxide, and triethanolamine for about thirty seconds.

It is believed that the hydrazine treatment attacks and slightly softens the surface in a very mild manner to prepare it for reception of palladium as described below but it does not effect the optical characteristics of the film. This hydrazine treatment contributes significantly to the good adhesion which is obtained in the finished product as will be described below. The use of hydrazine on other materials such as polyester is disclosed in, for example, application Ser. No. 724,810 filed Sept. 20, 1976 now U.S. Pat. No. 4,078,096.

Following the hydrazine treatment the film is immersed in a weak sodium hydrozide solution followed by immersion in a dilute HCl solution. Thereafter, the surface is catalyzed by contacting with a $PdCl_2$-$SnCl_2$ solution. This step is followed by immersion in an ammonium bifluoride solution to dissolve any residual stannous ion on the surface of the film. Thereafter, a blanket plating of electroless copper is provided over the entire surface of the film to a thickness of about two or three micro-inches. While this blanket plating covers the entire surface, it is relatively thin and in order to prevent any attack of the cellulose tri-acetate film, an additional fifty micro-inches of copper are electrolytically plated over the entire surface from a $CuSO_4$ bath, the bath temperature being about 43° to 49° C. The electroless copper serves as a bus to ensure electrolytic plating over the entire exposed surface. The film is then subjected to a cold water spray rinse and is dried at about 75° C. for a brief interval. A suitable resist such as AZ-340 is then applied to the entire surface, dried, and the film is baked at 75° C. for ten minutes. The resist is then exposed along the lines of the conductors, developed, and rinsed so that the lines which define the conductors are not covered by the resist. Copper is then electro-plated on the exposed areas to a thickness of about 250 micro-inches and after suitable cleaning and an acid dip, a thin plating (25 micro-inches) of nickel is deposited over the copper and about 30 micro-inches of gold is electro-deposited over the nickel. Alternatively, Pd, Ag or other etch resistant metal may be plated over the copper conductors. The resist is then stripped and the copper blanket is etched away by a $FeCl_3$ spray. Other etchants may be used such as an anomical etch.

In the foregoing brief description, it will be apparent that both surfaces of the film are being subjected to the process steps described and that a resist is applied to the entire surface 7 on which the switch conductors are not being produced. Under some circumstances, it is desirable to provide shielding conductors as shown at 46, FIG. 7, on the upwardly facing surface 7 of the film 6 and such shield conductors can be produced on this surface by exposing the resist on the surface, selectively developing and removing the resist, and then electro-depositing copper on the shielding conductor lines while the conductors 14 are being electro-deposited on the downwardly facing surface. Suitable shielding can be provided by producing 2 mil conductors on 100 mil center lines, ten lines per inch.

Figure 7:
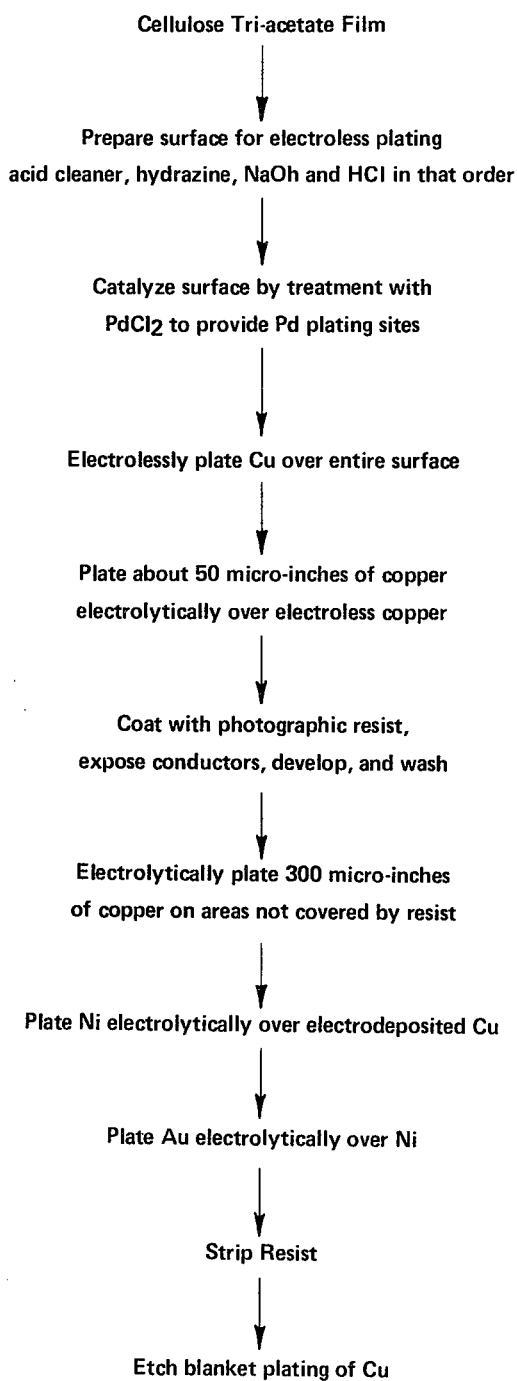
FIG. 7 is a fragmentary view of a switch having an integral grid of shielding conductors thereon.
Figure 4:
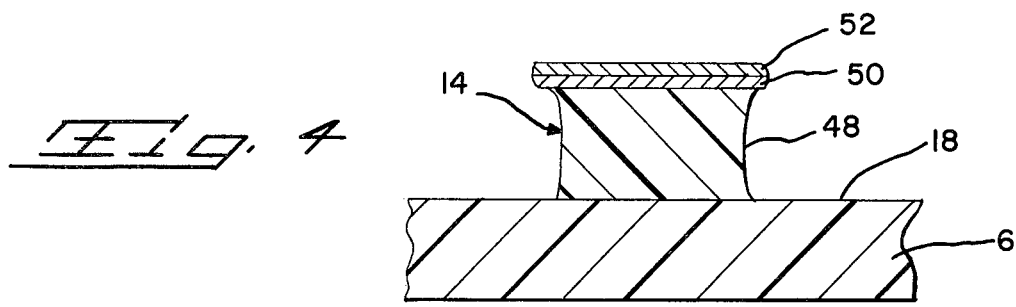
FIG. 4 is a cross sectional view of a conductor.
Figure 6:
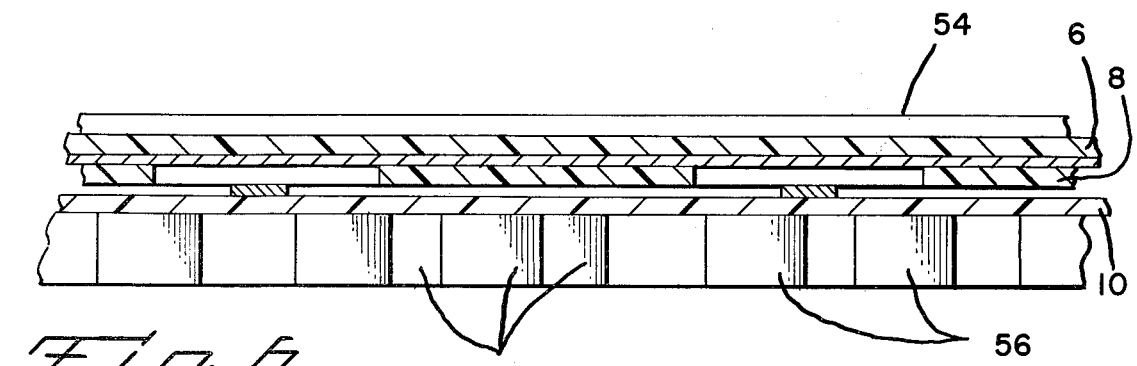
FIG. 6 is a cross sectional view of the switch assembly having a filter disposed over its surface.
Figure 7:
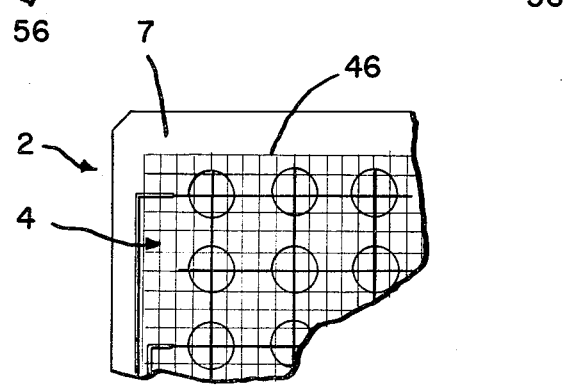

FIG. 4 shows a cross section of a switch conductor 14 on the surface 18 of the sheet 6 of film. The electro-deposited copper 48 constitutes the bulk of the conductor and the thin layers of nickel and gold 50, 52 extend beyond the sides of the copper plating as a result of undercutting during the etching process. It should be mentioned at this point that in all of the drawings, the width of the conductors is exaggerated, the actual widths being approximately 5 mils as mentioned previously. Thus the shielding conductors and the switch conductors would, in an actual switch, be much less obvious than they are shown in FIG. 7 and the width of the conductors is not sufficient to interfere with the observers view of the display area which is beneath the switch. FIG. 6 diagramatically shows or illustrates the use of the switch mechanism on the upper side of a battery of light admitting diodes 56. An arrangement such as this is shown and described fully in the previously mentioned report in the Nov. 11, 1976 issue of *Electronics*.

Figure 5:
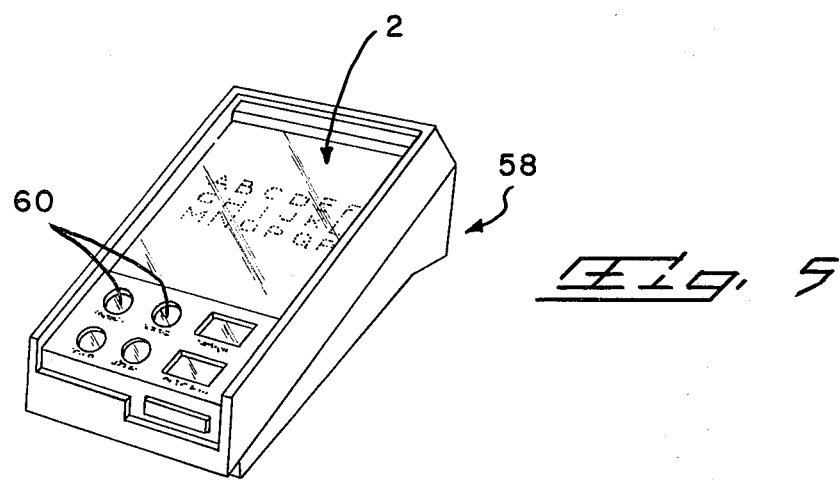
FIG. 5 is a perspective view of an interactive access terminal equipped with an optically clear switch assembly in accordance with the invention.

FIG. 5 shows an interactive access terminal 58 on which a switch assembly 2 is mounted. The fixed function switches 60 are provided at the lower end of the housing and the display area and switches are provided on the assembly 2 above these fixed function switches. In use of a device of this type, the operator will selectively close one or more of the switches on the display area and will thereafter be presented with the information which he called up by closing the switches.

The successful practice of the invention does require careful attention to the various cleaning, plating and other steps involved in the process and careful selection of the plating baths cleaning procedures and operating conditions, however, there are a variety of known techniques for electroless plating which are compatible with cellulose tri-acetate and which can be used in the practice of the invention. Electroless plating techniques are described in some detail in U.S. Pat. No. 3,791,939 and in a commonly available treatise on the subject, *Metallic Coating of Plastics*, Wm. Goldie, Electrochemical Publications Limited, 1968. As mentioned previously, the treatment of the film with the hydrazine-sodium hydroxide, triethanolamine solution is an important step in the process and it is believed that this treatment causes a chemical attack and softening of the cellulose surface and results in the formation of a gel on the surface. It is also probable that some complex species are entrapped in this gel, specifically a sodium alcoholate along with some sodium hydroxide and some hydrazine. It is additionally believed that other species might be present which might be formed with the acetyl groups on the surface such as acetyl hydrazide and acetate salts. Some of these entrapped species serve as catalytic agents for the deposition of palladium on the surface, particularly since the hydrazine can serve as a reducing agent to reduce the colloidal palladium ions to metallic palladium.

In the example given below, the $PdCl_2$ $SnCl_2$ solution used contained 0.67 gm/l of $PdCl_2$, 42 gm/l of $SnCl_2$ and 250 ml/l of HCl. Plating solutions of this type are commercially available from the MacDermid Corporation of Waterbury, Connecticut and are described in British Pat. No. 1,214,733. The copper bath used for electro-deposition of the copper conductors was of the general type described in detail in U.S. Pat. No. 3,329,512.

It has been found that when conductors are provided on cellulose acetate material in accordance with the invention, the optical clarity of the film will not be significantly affected. Films which have conductors thereon will generally have about 90% light transmission and the conductors will have a metal adhesion of about 5 pounds peel strength per linear inch.

As previously mentioned, cellulose acetate materials can be used with polarizing filters 54 as illustrated in FIG. 6 of the drawing and the acetate film will not depolarize light upon passage therethrough. By virtue of the fact, switch assemblies in accordance with the invention can be equipped with filters and used in ordinary daylight conditions.

Following is a specific example of a procedure followed to produce conductors on one surface of a film of cellulose tri-acetate.

EXAMPLE I

A 12 inch square sheet of cellulose tri-acetate having a thickness of 5 mils supplied by XCel Corp. 290, Fairy St., Newark, N.J., catalogue number HP-550 was cleaned of all surface oils and other foreign matter by immersion for 60 seconds in an aqueous detergent solution. The film was then washed under a 50° C. hot water spray and was then immersed for about 35 seconds in a solution composed of 70 parts of an 85% hydrazine hydrate solution, 25 parts of a 25% sodium hydroxide solution, and 5 parts of triethanolamine. The film was then again rinsed under a hot water spray (55° C.) and then immersed in a 1% sodium hydroxide solution for 30 seconds and then again rinsed under a hot water spray. It was then immersed in a 25% HCl solution for 30 seconds. The surface of the film was then catalyzed by immersion for 90 seconds in a commercially available palladium-tin colloidal solution. Thereafter, the film was washed in a cold water spray and immersed in a aqueous solution of ammonium bifluoride (MacDermid Corp. 9071) for 90 seconds. The film was then washed again under a cold water spray and dried in an oven for 5 minutes at a temperature of 60° C. A blanket coating of electroless copper having a thickness of about 3 to 5 micro-inches was provided on the film by immersion for 10 minutes in an electroless copper plating bath containing a soluble copper salt, a complexing agent to keep the copper in solution, sodium hydroxide to render the solution alkaline, and formaldehyde as a reducing agent (Shipley 328 Q bath available from Shipley Corp., Newton, Mass.). After removal of the film from this electroless plating bath, it was rinsed under a cold water spray, dried by an air blast, and placed in an oven at 60° C. for 3 minutes. The film was then placed on a rack and an additional blanket plating of 50 micro-inches of copper was deposited electrolytically from an acid copper sulfate bath. The film was then washed under a cold water spray, air dried and placed in an oven at 75° C. for two minutes. The film was then coated by immersion in a liquid photo resist sensitive to ultra violet light (Shipley AZ-340), dried at room temperature for 10 minutes and baked at 75° C. for 10 minutes. The pattern was developed by selective exposure to ultra violet light and immersion in a developing solution. The film was then rinsed in a cold water spray and racked for electroplating of the circuitry. The surface was activated by mild sponging with a detergent solution and washed under a cold water spray. Thereafter, the rack was dipped in a ten percent sulfuric acid solution for 5 seconds, rinsed under a cold water spray, and electroplated to a thickness of 300 micro-inches in an acid copper sulfate bath. After this electroplating step, the film was rinsed under a cold water spray, it was again dipped in a 10 percent sulfuric acid solution for 5 seconds, and again rinsed under a cold water spray. 25 micro-inches of nickel were then electroplated over the copper from a nickel sulfamate bath, the film was then washed under a cold water spray, dipped in a 10 percent sulfuric acid for 5 seconds, and the film was again washed under a cold water spray. A bright gold plating having a thickness of about 32 micro-inches of gold was then electroplated over the nickel from a neutral cyanide gold bath. The film was then washed under a cold water spray, the resist was stripped from both sides or surfaces of the film and the blanket copper plating was etched away by spraying with a ferric chloride etchant. The film was then again rinsed under a cold water spray and dried under an air blast.

After stripping of the blanket plating, the film was observed to have a light transmission of about 92%. The conductors had an adhesion in the range of 4 to 5 poinds per linear inch.

EXAMPLE II

A sheet of cellulose tri-acetate having a thickness of 5 mils supplied by Eastman Kodak Company was cleaned of all surface oils and other foreign matter by immersion for 30 seconds in an aqueous detergent solution. It was then washed under a hot water spray (55° C.) and immersed for 30 seconds in a solution made up of 70 parts of an 85% hydrazine solution, 25 parts of a 25% NaOh solution and 5 parts triethanolamine. It was then immersed for 30 seconds in a 1% NaOh solution, washed in a hot water spray (55° C.) and then immersed in a 25% HCl solution for 15 seconds. Thereafter, the surface of the film was catalyzed by immersion for 60 seconds in a palladium-tin colloidal solution for catalyzation, washed under a cold water spray and immersed for 60 seconds in an aqueous solution of ammonium bifluoride as descried in Example I. It was then washed in a cold water spray and baked in an oven at 60° C. for about 5 minutes. A blanket coating of electroless copper was provided as described in Example I, the immersion time being 10 minutes. The sheet of film was then again washed under a cold water spray, dried under an air blast, baked at a temperature of 60° C. for 3 minutes. The steps outlined in Example I beginning with the electro-deposition of the blanket coating were then followed. After stripping of the blanket plating, the film had substantially the same characteristics as the film of Example I.

In the examples presented above, both surfaces of the sheets of acetate film are provided with the blanket coatings of copper. Ordinarily, the resist material will be applied to the surface of the film on which switch conductors are not being provided and the blanket coatings will then be removed at the time of etching.

As shown in FIG. 7, it is desirable, under some circumstances, to provide a shielding grid 46 of conductors on the upwardly facing surface of the film 6. This shielding grid can be produced by simply selectively developing the blanket conductor coating on the upwardly facing surface of the film 6 and electro-depositing the shielding conductors thereon.

Cellulose acetate materials other than cellulose tri-acetate can be used in the practice of the invention. For example, conductors have been provided on cellulose acetate butyrate by the procedures outlined above in examples I and II with minor changes. In general, when conductors are being provided on cellulose acetate butyrate, the film should be baked at 120° C. for about 5 minutes before electroless deposition and the film should be treated in the hydrazine solution for 90 seconds or more. After the electroless metallization step, the film should then be baked again at 120° C. for about 5 minutes. In other respects, the procedures discussed above can be followed.

Cellulose acetate butyrate film having a thickness of 15 mils was provided with conductors in accordance with the invention and appeared to be suitable for use as the substrate of the switch assembly (the film 10 of FIG. 6). A relatively thinner film is desirable for the film 6 since this film must be flexible.

Cellulose di-acetate can also be used in the practice of the invention and as is apparent from examples I and II above, film from either of the available commercial sources (Eastman Kodak Company and XCel Corp.) have been successfully provided with conductors.

A distinct advantage of the invention is that it avoids the use of an adhesive as is required in processes in which a laminate (metal to plastic film) produced by bonding metal foil to the film is etched. When the laminate is produced by bonding thin metal film to plastic, an adhesive must be used to bring about the bond of the metal to the plastic. The use of an adhesive causes deragation of the optical properties of the film to the extent that switches produced by these types of processes are only marginally functional and are far from satisfactory. The adhesive is, of course, not removed when the etching step is carried out so that it remains on the surface of the film as an extra layer through which light must pass, a layer, moreover, which will usually have inferior light transmission characteristics and will have an index of refraction which is different from that of the film. It will thus be apparent that the presence of an adhesive layer can only cause mischief in an optically clear membrane switch.

Membrane switches in accordance with the invention have also been found to be highly desirable by virtue of the fact that the electro-deposited and etched conductors can be made extremely narrow (about 5 mils or less) as compared with the conductors on plastic films which are conventionally produced by silk screening operations. Silk screened conductors usually have a minimum width of about 10 mils and conductors of this width may interfere with the view of the display behind the screen or switch. The narrow conductors achieved in accordance with the invention also permits extremely precise location of each switch site which is in the geometric center of the openings 34. Precise location of the switch sites is desirable in that it facilitates miniaturization of the switch.

What is claimed is:

1. A transparent laminate having at least one membrane switch therein, said laminate comprising:
   first, second, and third laminated sheets of transparent film, said first and third sheets being of a cellulose acetate material, said second sheet being between said first and third sheets, said first and third sheets having internal surfaces which are against said second sheet, said second sheet having an opening therein, said opening constituting a switch point,
   each of said internal surfaces having an electrodeposited hairline conductor thereon, said conductors crossing, and being normally spaced from each other, at said switch point,
   said hairline conductors having been produced on said internal surfaces by the steps of rendering said surfaces conductive by electroless deposition of a thin blanket coating of conductive metal on said surfaces, selectively depositing a thick plating along lines which define said hairline conductors, and thereafter selectively etching away said blanket coating and leaving said hairline conductors on said surfaces.

2. A laminate as set forth in claim 1, said first, second, and third sheets being of cellulose tri-acetate.

3. A laminate as set forth in claim 2, said first sheet having an external surface, a shielding grid of hairline shielding conductors on said external surface, said shielding conductors having been produced during production of said hairline conductors on said first sheet by the steps followed to produce said hairline conductors on said internal surface of said first sheet.

4. A transparent laminate having a plurality of membrane switches herein, said laminate being intended for use in a terminal or the like in covering relationship to the display area of the terminal, said laminate comprising:
   first, second, and third laminated sheets of transparent cellulose tri-acetate film, said second sheet being between said first and third sheets, said first and third sheets having internal surfaces which are against said second sheet, said second sheet having an opening therein, said opening constituting a switch point,
   each of said internal surfaces having an electrodeposited hairline conductor thereon, said conductors crossing, and being normally spaced from each other, at said switch point,
   said hairline conductors having been produced on said internal surfaces by the steps of rendering said surfaces conductive by electroless deposition of a thin blanket coating of conductive metal on said surfaces, selectively depositing a thick plating along lines which define said hairline conductors, and thereafter selectively etching away said blanket coating and leaving said hairline conductors on said surfaces,
   said first sheet having an external surface, a shielding grid of hairline shielding conductors on said external surface, said shielding conductors having been produced during production of said hairline conductors on said first sheet by the steps followed to produce said hairline conductors on said internal surface of said first sheet.

5. A method of manufacturing an optically clear film having a hairline conductor thereon, said film being useful in the production of an optically clear membrane switch, said method comprising the steps of:
   preparing one surface of a film of cellulose acetate material for electroless plating by cleaning and activating said surface by a series of steps comprising contacting said surface with a hydrazine solution,
   electrolessly plating a blanket coating of copper over the entire area of said one surface, coating said surface with a resist, and removing said resist along a line which defines the path of said conductor, electrolytically plating copper on said substantially to the desired thickness of said conductor, electrolytically plating nickel over said copper, and thereafter electrolytically plating an etch resistant contact metal over said nickel, and removing said resist and etching away said blanket plating of copper.

6. The method set forth in claim 5, said cellulose acetate material comprising cellulose tri-acetate.

7. The method set forth in claim 6, said hydrazine solution comprising a hydrazine-sodium hydroxide tri-ethanol amine solution.

8. A method of providing an optically clear film having a hairline conductor on one surface thereof, said method comprising the steps of:

electrolessly plating a blanket coating of a conductive metal on one surface of a film of a cellulose acetate material, coating said surface with a resist, and removing said resist along a line which defines the required path of said conductor, electrolytically plating copper on said line substantially to the thickness desired in said conductor, plating an etch resistant conductive metal over said copper, and removing said resist and etching away said blanket coating of copper.

* * * * *